United States Patent [19]

Djaja et al.

[11] Patent Number: 5,359,535
[45] Date of Patent: Oct. 25, 1994

[54] METHOD FOR OPTIMIZATION OF DIGITAL CIRCUIT DELAYS

[75] Inventors: Gregory Djaja, Tempe; Timothy J. Jennings, Chandler; Douglas W. Schucker; Frederic B. Shapiro, both of Mesa, all of Ariz.

[73] Assignee: Motorola, Inc., Schaumburg, Ill.

[21] Appl. No.: 878,062

[22] Filed: May 4, 1992

[51] Int. Cl.$^5$ .............................................. G06F 15/16
[52] U.S. Cl. .................................. 364/489; 307/590; 364/569; 364/577; 364/578; 371/23
[58] Field of Search ................... 364/488–491, 364/577, 578, 569, 571.07; 307/590; 371/21.4, 22.1, 23

[56] References Cited

U.S. PATENT DOCUMENTS

| | | | |
|---|---|---|---|
| 4,263,651 | 4/1981 | Donath et al. | 364/300 |
| 4,698,760 | 10/1987 | Lembach et al. | 364/490 |
| 4,907,180 | 3/1990 | Smith | 364/578 |
| 4,970,664 | 11/1990 | Kaiser et al. | 364/521 |
| 5,051,911 | 9/1991 | Kimura et al. | 364/468 |
| 5,105,374 | 4/1992 | Yoshida | 364/578 |
| 5,206,889 | 4/1993 | Unkrich | 377/20 |
| 5,239,481 | 8/1993 | Brooks et al. | 364/486 |
| 5,245,543 | 9/1993 | Smayling et al. | 364/468 |
| 5,274,568 | 12/1993 | Blinne et al. | 364/489 |

OTHER PUBLICATIONS

O'Brien et al., "Modeling the Driving–Point Characteristic of Resistive Interconnect for Accurate Delay Estimation", IEEE, 1989, pp. 512–515.

Patel, Dhimant, "CHARMS: Characterization and Modeling System for Accurate Delay Prediction of ASIC Designs", IEEE 1990 Custom Integrated Circuits Conference, pp. 9.5.1–9.5.6.

*Primary Examiner*—Thomas G. Black
*Assistant Examiner*—Leigh Marie Garbowski

[57] ABSTRACT

A method for optimization of delay times in a digital circuit. The method comprises selecting a logic gate (12), and constructing a model (35) which predicts the delay time (27) of the logic gate (12). Varying the parameters which control the model to more accurately predict the delay time (48). Summing the delay time (48) due to each logic gate (12) which comprises the signal path. Repeating the method for each signal path within the digital circuit until all signal paths are computed. Modifying the digital circuit based on the calculated delay times (48) so as to better satisfy a predetermined measurement criteria.

7 Claims, 2 Drawing Sheets

METHOD FOR OPTIMIZATION OF DIGITAL CIRCUIT DELAYS

BACKGROUND OF THE INVENTION

The present invention relates, in general, to design of digital circuits, and more particularly to optimization of delay times in a large digital integrated circuit.

Optimization of the delay times in large digital integrated circuits typically uses a calculation of a total delay time for each signal path. The calculation is then compared with a predetermined target delay time for that signal path. The signal path is then modified so as to more closely achieve the predetermined target delay time. A typical method used to calculate the total delay time lacks accuracy but can calculate the total delay time rapidly. When compared with a more accurate but slower circuit simulator such as SPICE, the relative error of the typical method may be 20% to 30% even for the best case simulation. But a circuit simulator like SPICE is far too slow to use for delay optimization. With the increased speed of submicron integrated circuits, errors are often as large as the total delay between gates. Under some conditions these errors result in damaging absurdities such as negative delay times. As a result, the optimization process either fails completely or is not effective. Either eventuality results in a design which can only operate at a lower speed than would otherwise be possible or may have hidden faults which cause incorrect operation.

There is need for a method for optimization of digital circuit delays in high speed digital circuits which more accurately models the circuit delays, yet does not require excessive computation. Ideally the delay values computed by such a method should agree with the delay values calculated by a circuit simulator to within 3% to 5%. The method should ensure that any calculation errors are reasonable and that such errors can never cause the circuit optimization to fail.

SUMMARY OF THE INVENTION

Briefly stated, the present invention provides a method for optimization of delay times in a large digital integrated circuit. The method comprises constructing a logic gate model including predetermined parameters which control the logic gate model to account for the effects due to the interconnect line and load. Varying these predetermined parameters so as to achieve the best overall estimate of delay time of the logic gate due to a variety of loads and interconnect lines. Selecting a signal path made up from a logic gate, an interconnect line and a load. Interpolating the predetermined parameters which control the logic gate model, based on the actual interconnect line and the actual load, to simulate the delay time of the logic gate. Summing the delay time due to each logic gate and each actual interconnect line which comprise the signal path. Repeating the method for each signal path within a large integrated circuit until all signal paths are computed. Modifying the circuit based on the calculated delays so as to better achieve predetermined constraints.

DETAILED DESCRIPTION OF THE DRAWINGS

Figure 1:
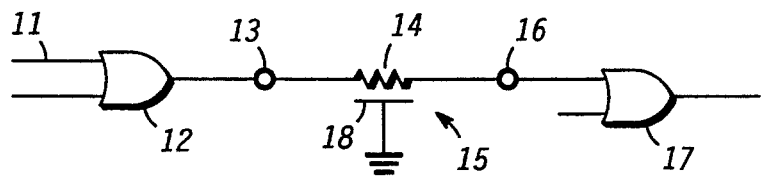
FIG. 1 shows a schematic drawing which illustrates a typical portion of a large digital integrated circuit.

FIG. 1 shows a schematic drawing which illustrates a typical portion of a large digital integrated circuit. The large digital integrated circuit is partitioned into a plurality of signal paths. Each signal path represents the path of a state change presented to an input node as it propagates through the circuit to an output node. The signal path is then further subdivided into a plurality of logic gates with a means for coupling the signal to a succeeding logic gate. The signal delay through the logic gate and coupling means are calculated and the total delay along a signal path is calculated by summing the delay through each portion of the signal path.

A single signal path is selected which typically comprises a single logic gate 12, a predetermined interconnect line 15 and a predetermined load 17. Predetermined load 17 is typically a second logic gate, but could comprise any of a wide variety of electrical loads such as a LED, resistor, or relay. A first input node 11 controls the operation of single logic gate 12. Single logic gate 12 is representative of the variety of gate types used in a typical digital integrated circuit. Single logic gate 12 has an output node 13 which is coupled to a second input node 16 which in turn controls load gate 17. A distributed resistance 14 and a distributed capacitance 18 serve to model the predetermined interconnect line 15 according to methods well known in the art. A plurality of distributed resistances 14 and a plurality of distributed capacitances 18 represent a plurality of integrated circuit elements which couple electrical signals between output node 13 and second input node 16. The plurality of integrated circuit elements comprise a network of metal traces, contacts, diffused conductors and the like which are fabricated as part of the integrated circuit structure.

Figure 2:
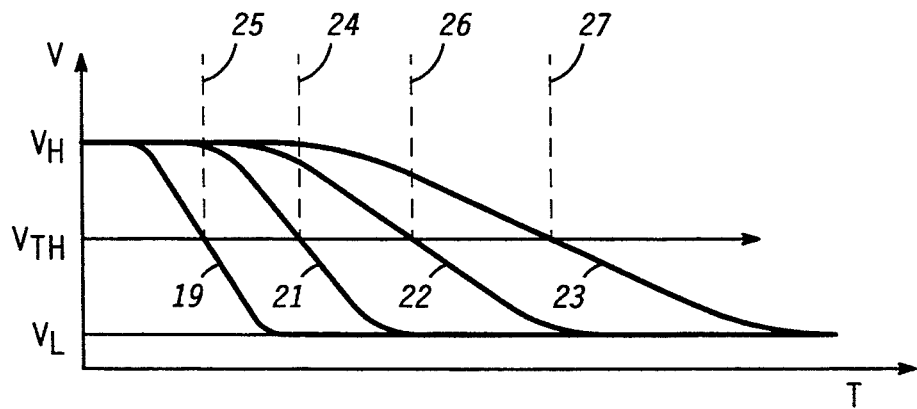
FIG. 2 shows a timing diagram illustrating voltage changes with respect to time for the circuit shown in FIG. 1.

FIG. 2 shows a timing diagram illustrating voltage changes with respect to time for the circuit shown in FIG. 1. For brevity, only the transition of a signal from a logic high voltage $V_H$ to a logic low voltage $V_L$ is shown in the drawing, however the description and methods embodying the present invention apply also to the transition from logic low voltage $V_L$ to logic high voltage $V_H$. A voltage designated as $V_A(t)$, is applied to first input node 11. For simulation purposes, a voltage source generates an input voltage 19 which is used to emulate the voltage designated as $V_A(t)$. This results in an unloaded output voltage 21 designated as $V_{B0}(t)$, at output node 13 (FIG. 1) if the effects of output loading on single logic gate 12 (FIG. 1) are not considered. Allowing for the loading effects which are induced by distributed resistance 14, distributed capacitance 18 and second input node 16 results in a loaded output voltage 22 designated as $V_B(t)$, at output node 13 (FIG. 1). The delay through the interconnect results in a driving voltage 23 designated as $V_C(t)$ at second input node 16. A switching threshold $V_{TH}$ is defined as a median voltage between logic high voltage $V_H$ and logic low voltage $V_L$. For convenience, delay times are measured relative to the point at which a voltage waveform crosses switching threshold $V_{TH}$. Input voltage 19 changes from logic high voltage $V_H$ to logic low voltage $V_L$ logic thereby crossing switching threshold $V_{TH}$ input time 25. An unloaded gate time 24, designated as $T_{B0}$, measures the delay time caused by single logic gate 12 (FIG. 1) in an unloaded state. Likewise a loaded gate delay time 26, designated as $T_B$, measures the delay time caused by single logic gate 12 with a predetermined load. A total delay time 27, designated as $T_C$, measures the delay caused by single logic gate 12, distributed capacitance 18, distributed resistance 14, and second input node 16.

The prior art contains numerous methods for predicting the component of delay through interconnect wiring. One such method which is suited for use with the preferred embodiment is described in the paper entitled "Modeling the Driving-Point Characteristic of Resistive Interconnect for Accurate Delay Estimation", by P. O'Brien et al, IEEE International Conference on Computer Aided Design 1989 Digest of Papers, pages 512 to 515, which is incorporated herein by reference. The method described calculates the input admittance of an interconnect line, reducing the complex line to a simple network.

Figure 3:
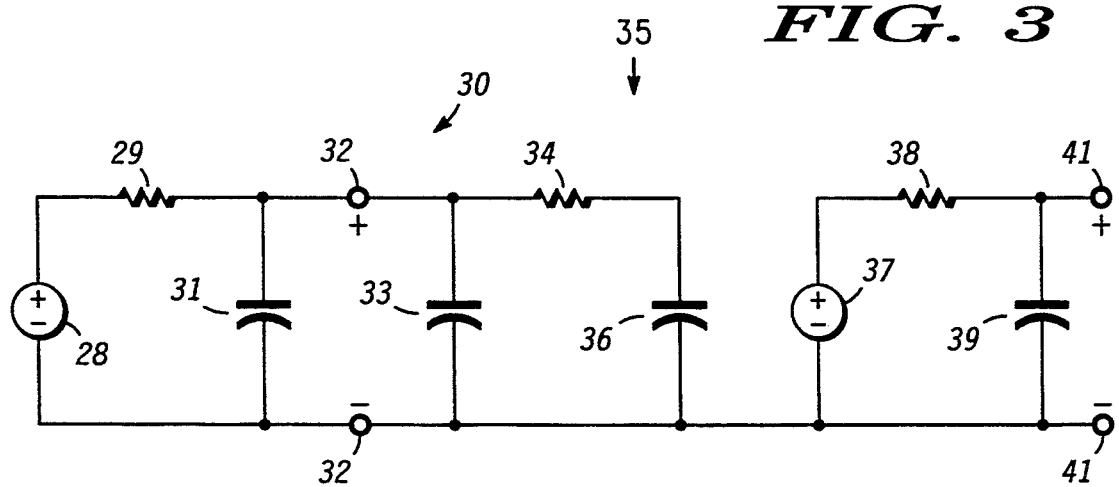
FIG. 3 shows a schematic drawing representing an electrical model of the circuit shown in FIG. 1 as a preferred embodiment of the present invention.

FIG. 3 shows a schematic drawing which represents an electrical model 35 which predicts the behavior of an ideal logic gate similar to single logic gate 12 (FIG. 1). Electrical model 35 comprises a logic gate model 30 which combines the gate source characteristics, the admittance of the loads, and the admittance of the interconnect line. A voltage source 28 is used to emulate input voltage 19 (FIG. 2). The waveform from voltage source 28 is typically considered to change linearly from logic high voltage $V_H$ to logic low voltage $V_L$ starting to change state at a start time $T_F$. A transition time designated as $T_0$ is the time for the waveform from voltage source 28 to change between logic high voltage $V_H$ and logic low voltage $V_L$. An intrinsic gate delay time constant designated as $T_S$ is modelled as a resistor 29 coupled to a capacitor 31. Resistor 29, designated as $R_S$ couples voltage source 28 to capacitor 31, designated as $T_S/R_S$, a node 32 having a voltage which varies with time, designated as $V_B(t)$, a capacitor 33 designated as $C_{33}$, and a resistor 34 designated as $R_{34}$. Resistor 34 in turn is coupled to a capacitor 36 designated as $C_{36}$. A voltage source 37 is controlled by node 32. Voltage source 37 is coupled to a resistor 38 having a normalized value of one ohm and a capacitor 39 designated as $T_D$. Capacitor 39 is designated as $T_D$ since its value is expressed in terms of the delay time of the network formed by resistor 38 and capacitor 39. A node 41 has a voltage which varies with time designated as $V_C(t)$. Analysis of electrical model 35 allows the response of node 41 to be written in the Laplace domain as an equation 1 below:

$$V_C(s) = \frac{V_L}{s} + \frac{(V_H - V_L)}{T_0} \left[ \frac{e^{-sT_F} - e^{-s(T_F + T_0)}}{s^2} \right] a$$

Where:

$$a = \left[ \frac{1 + sR_{34}C_{36}}{1 + s[T_S + R_S(C_{36} + C_{33}) + R_{34}C_{36}] + s^2[(T_S + R_SC_{33})R_{34}C_{36}]} \right]\left[ \frac{1}{1 + sT_D} \right]$$

Note that the terms used in equation 1 have been defined hereinbefore.

The inverse Laplace Transform gives the response of node 41 for three distinct time intervals according to the following equations using the elements as defined above.

For the interval $0 \leq t < T_F$, according to equation 2 below:

$$V_C(t) = V_L,$$

for the interval $T_F \leq t < (T_0 + T_F)$, according to equation 3 below:

$$V_C(t) = V_L + \frac{(V_H - V_L)}{T_0} [(t - T_F) - t_{DS1} +$$

$$a_1 e^{-S_1(t - T_F)} + a_2 e^{-S_2(t - T_F)} + a_3 e^{-(t - T_F)/T_D}],$$

and for the interval $(T_0 + T_F) \leq t < \infty$, according to equation 4 below:

$$V_C(t) =$$

$$V_L + \frac{(V_H - V_L)}{T_0} \begin{bmatrix} T_0 + a_1(e^{-S_1(t - T_F)} - e^{-S_1(t - T_F - T_0)}) \\ a_2(e^{-S_2(t - T_F)} - a_1 e^{-S_2(t - T_F - T_0)}) + \\ a_3(e^{-(t - T_F)/T_D} - e^{-(t - T_F - T_0)/T_D}) \end{bmatrix}.$$

Expanding the factors found in equations 2, 3, and 4 above:

$$t_{DS1} = R_S \left( C_{36} + C_{33} + \frac{T_S}{R_S} \right) + T_D$$

$$a_1 = \frac{S_2(R_{34}C_{36}S_1 - 1)}{2S_1w(1 - S_1T_D)}$$

$$a_2 = \frac{-S_1(R_{34}C_{36}S_2 - 1)}{2S_2w(1 - S_2T_D)}$$

$$a_3 = \frac{-(T_D^2)(R_{34}C_{36} - T_D)y}{(1 - S_1T_D)(1 - S_2T_D)}$$

$$S_1 = u + w$$
$$S_2 = u - w$$

$$w = \sqrt{u^2 - y}$$

$$u = \frac{1}{2}\left( R_S\left( C_{36} + C_{33} + \frac{T_S}{R_S} \right) + R_{34}C_{36} \right)y$$

-continued $$y = \frac{1}{R_S R_{34} C_{36} \left( C_{33} + \frac{T_S}{R_S} \right)}.$$

For convenience, electrical model 35 is typically expressed in a form similar to equations 2, 3, and 4 (above) which allows calculation of driving voltages 21, 22, and 23 (FIG. 2) of logic gate model 30 at any desired time. However, analysis of the model requires fabrication of a prototype logic gate having a plurality of predetermined interconnect lines and a plurality of predetermined loads which models single logic gate 12 (FIG. 1), predetermined interconnect line 15 (FIG. 1), and predetermined load 17 (FIG. 1). Input voltage 19 (FIG. 2) is applied to first input node 11 by means of a circuit simulator such as SPICE. When driving voltage 23 of single logic gate 12 (FIG. 1) has the predetermined values of 10%, 50% and 90% of the total transition from $V_H$ to $V_L$, the corresponding delay times are recorded in a characterization table for this loading condition. The measurement and recording steps are then repeated for each of a plurality of loading conditions. For a predetermined loading condition and when driving voltage 23 or $V_C(t)$ is one of the predetermined values, a time t is determined by reference to the characterization table. In a preferred embodiment of the present invention the characterization table is used for development and validation of electrical model 35. An alternative embodiment of the present invention, uses the characterization table directly to determine desired time t at a predetermined $V_C(t)$ and load during the optimization process.

According to the prior art, one of the iterative methods well known in the art is used to recompute $V_C(t)$ for various values of t until a value of t is found such that $V_C(t) \approx V_{TH}$, or in other words $t \approx T_C$. This method has the disadvantage that many computations of the above equations are required which uses excessive computer time. A large digital integrated circuit may comprise a million or more gates and associated interconnect wiring. When analyzing such a large digital integrated circuit, these added computations are prohibitively expensive both in elapsed time and in design costs.

Figure 4:
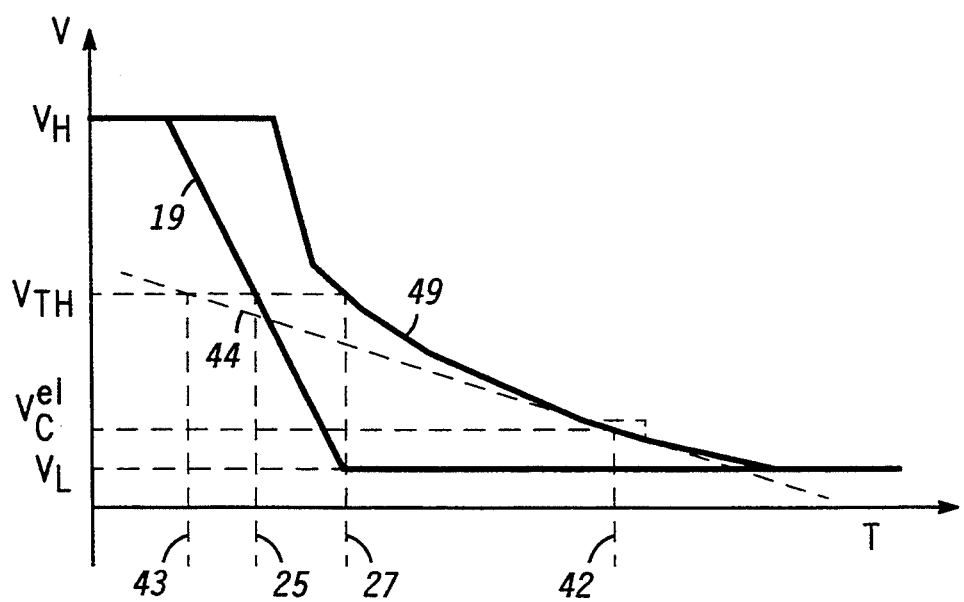
FIG. 4 shows part of the timing diagram of FIG. 2.

FIG. 4 shows part of the timing diagram of FIG. 2 which plots voltage changes with respect to time for the circuit shown in FIG. 1 with a linear interpolation according to the prior art. To avoid excessive computation, the prior art uses a single iteration method to find $T_C$, total delay time 27. Analysis of electrical model 35 gives a readily calculated Elmore delay time where $T_C^{el} \approx T_C$. The Elmore delay time, $T_C^{el}$, is a method for delay time estimation well known in the art based on the step function response in terms of the first moment of the impulse response. $T_C^{el}$ is calculated using an equation 5 below:

$$T_C^{el} = T_F + \frac{T_0}{2} + T_S + R_S(C_{36} + C_{33}) + T_D.$$

Using $T_C^{el}$ as an initial estimate for t, a value $V_C(T_C^{el})$ may be calculated using equation 2, 3, or 4. Using $V_C(T_C^{el})$, an error quantity may be calculated as $\Delta V_C = V_C(T_C^{el}) - V_{TH}$, where $V_{TH} = V_C(T_C)$. A linear interpolation 44 is calculated using an equation 6 below:

$$T_C^{est} \approx T_C^{el} - \frac{V_C(T_C^{el}) - V_{TH}}{\frac{dV_C(T_C^{el})}{dt}}.$$

The quantity $$\frac{dV_C(T_C^{el})}{dt}$$

in the denominator of equation 6 is calculated by differentiating equations 2, 3, or 4 for the corresponding time interval and evaluating the resulting equation at $T_C^{el}$.

Linear interpolation 44 intersects $V_{TH}$ at a time 43 and is designated as $T_C^{est}$. A typical circuit such as that shown in FIG. 1 will have an Elmore delay time 42, designated as $T_C^{el}$, which is later than total delay time 27. Additionally, due to the nonlinear curve of voltage 49, linear interpolation 44 will always calculate time 43 earlier than total delay time 27. The combined effect can result in time 43 calculated as prior to input time 25, a negative delay time value. Not only is this an absurdity, but a negative delay time value will cause other design software to produce damaging results. For example an automated design system using this information will attempt to reduce the total delay time of a critical signal by introducing extraneous gates. This is a highly undesirable situation which could cause the optimization to fail.

Figure 5:
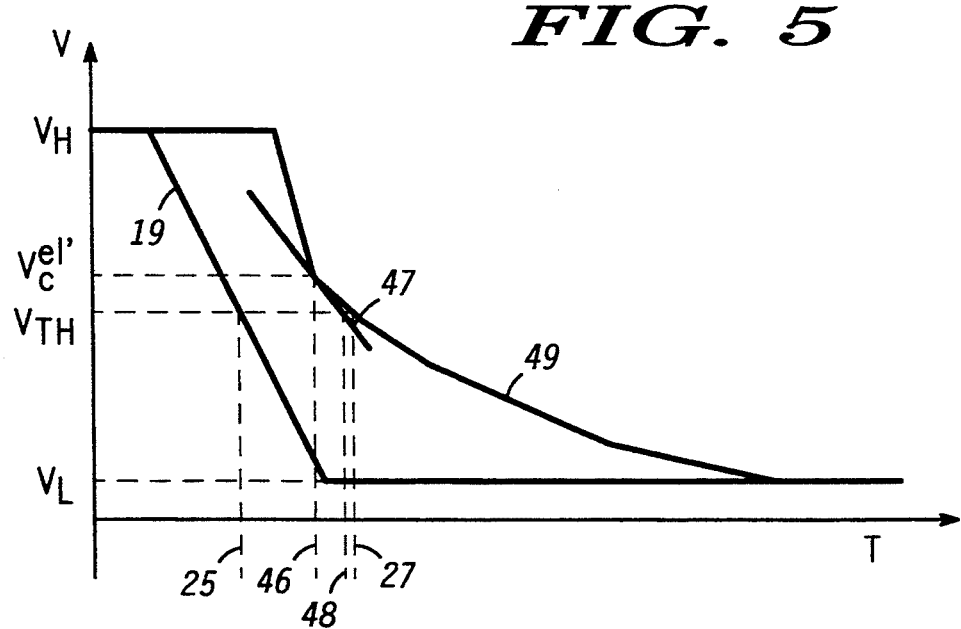
FIG. 5 shows part of the timing diagram of FIG. 2 and a linear interpolation as a preferred embodiment of the present invention.

FIG. 5 shows part of the timing diagram of FIG. 2 with a linear interpolation based on calculation of a modified Elmore delay time 46 according to a preferred embodiment of the present invention. In this preferred embodiment, the accuracy of the calculation is enhanced by using a set of piecewise linear values for the three terms $T_F$, $T_0$, and $T_S$. The piecewise linear values of $T_F$, $T_0$, and $T_S$ vary according to gate loading, that is the sum of the values of capacitor 33 and capacitor 36 (FIG. 3). The piecewise linear values of $T_F$, $T_0$, and $T_S$ are adjusted so as to achieve the most accurate fit of total delay time 27 to the entire characterization table (FIG. 2). The piecewise linear values for $T_F$, $T_0$, and $T_S$ are then used for all calculations.

To avoid the situation shown in FIG. 4, electrical model 35 (FIG. 3) is then altered to a modified electrical model which has a delay time which is always less than total delay time 27. Using the modified electrical model, a modified Elmore delay time 46, designated as $T_C^{el'}$, is calculated using an equation 7 below:

$$T_C^{el'} = T_F + \frac{T_0}{2} + 0.693 T_S + R_S C_{33} + T_D$$
for $(T_0 - T_F) \leq T_S,$ $$T_C^{el'} = T_F + \frac{T_0}{2} + T_S + R_S C_{33} + T_D$$
for $(T_0 - T_F) > T_S.$ This calculation modifies electrical model 35 (FIG. 3) by deliberately ignoring the effect of capacitor 36 (FIG. 3) which is designated as $C_{36}$ in equation 5. Thus the internal delay time of a lesser loaded gate is calculated which approximates unloaded gate time 24 (FIG. 2) rather than the more accurate loaded gate delay time 26 (FIG. 2). As a result, modified Elmore delay time 46 will always be earlier than total delay time 27. Modified Elmore delay time 46 is an initial estimate of the total delay time of single logic gate 12 (FIG. 1) which is known to be less than the actual total delay time of single logic gate 12 (FIG. 1).

Equation 7 uses two calculation regions for greater accuracy. The equation for $(T_0-T_F) \leq T_S$ is used to calculate modified Elmore delay time 46 when input voltage 19 (FIG. 2) changes more rapidly than the time constant of resistor 29 and capacitor 31 (FIG. 3). Thus the slope of voltage 49 is determined by the time constant of resistor 29 and capacitor 31 (FIG. 3). The equation for $(T_0-T_F) > T_S$ is used to calculate modified Elmore delay time 46 when input voltage 19 (FIG. 2) changes more slowly than the time constant of resistor 29 and capacitor 31 (FIG. 3). Under these conditions the slope of voltage 49 is determined by the slope of input voltage 19 (FIG. 2).

Using equation 6 for a linear interpolation 47 now results in a calculated delay time 48 which is much closer to total delay time 27. In addition the correction factor added by linear interpolation 47 is forced to a positive value so the absurdity of an overall negative gate delay time similar to time 43 (FIG. 4) can never occur.

A method for optimization of digital circuit delays as a preferred embodiment of the present invention first constructs electrical model 35 (FIG. 3) for a typical logic gate. Electrical model 35 (FIG. 3) predicts a driving voltage of the logic gate at a desired time when driving a predetermined load. The preferred method allows optimization of a digital circuit having at least one signal path which includes at least one logic gate at least one predetermined interconnect line having an interconnect delay time and at least one predetermined load. A single signal path is selected, and a single gate is selected from the single signal path. Using modified Elmore delay time 46 and a set of piecewise linear values for the three terms $T_F$, $T_0$, and $T_S$, an initial estimate of the total delay time of single logic gate 12 (FIG. 1) is found. This initial estimate of the total delay time is always less than the actual total delay time 27 (FIG. 2). Electrical model 35 (FIG. 3) is used to predict driving voltage 23 (FIG. 2) from single logic gate 12 (FIG. 1) based on the initial estimate of the total delay time of single logic gate 12 (FIG. 1), predetermined interconnect line 15 (FIG. 1) associated with single logic gate 12, and predetermined load 17 (FIG. 1) associated with predetermined interconnect line 15. The initial estimate of total delay time, modified Elmore delay time 46, is refined by using the driving voltage at the initial estimate of the total delay time as the basis for linear interpolation 47 to later calculated delay time 48 when the driving voltage will equal a predetermined switching threshold voltage.

The calculation steps are then repeated for each logic gate and each interconnect line which make up the signal path to calculate a total signal path delay time. The total signal path delay time is computed for each signal path comprising the digital circuit. The total signal path delay time for each signal path is then compared with a predetermined measurement criteria such as a predetermined target delay time for the signal path. The predetermined target delay time is typically a minimum delay time, but may also be a requirement for matching the delay time of another signal path or a constraint such as a falling between a maximum delay time and a minimum delay time. Alternative embodiments of the present invention use other predetermined measurement criteria such as a formula based on the product of chip area and minimum signal path delay time. This comparison is then repeated for each signal path within the digital circuit. The signal paths are then modified so as to achieve a total signal path delay time which is closer to the predetermined target delay time. Modification of the signal path typically comprises such revisions as re-routing of the interconnect lines, exchanging one logic gate for another having a different signal delay time, modification of the gate itself by increasing output current level, and partitioning a signal path which is coupled to more than one gate input into a plurality of smaller sub-paths.

The method of the present invention provides an accurate value for the total delay time for a signal to pass through a logic gate and interconnect line to a subsequent input. This value may be rapidly calculated without a time consuming iterative computation, yet the delay values computed typically agree with the delay values calculated by a circuit simulator to within 3% to 5%. This calculation is repeated for each signal path of a large digital circuit and is the basis for modifying the circuit to achieve an optimal design. The method cannot produce absurd results which cause the optimization to fail.

We claim:

1. A method for optimization of digital circuit delays, comprising:

constructing an electrical model of an ideal logic gate which predicts a driving voltage from the ideal logic gate at a desired time when driving a predetermined load combined with a predetermined interconnect line;

refining the electrical model by adjustment of predetermined parameters to enhance accuracy;

providing a digital circuit having a plurality of signal paths each of which includes a plurality of logic gates and a plurality of predetermined interconnect lines associated with the logic gates, the predetermined interconnect lines each having an interconnect delay time, and at least one predetermined load associated with each interconnect line;

selecting a single signal path from the digital circuit;

selecting a single logic gate from the single signal path, the predetermined interconnect line associated with the single logic gate, and the predetermined load associated with the interconnect line;

calculating an initial estimate of the total delay time of the single logic gate which is known to be less than the actual total delay time of the single logic gate;

predicting the driving voltage from the single logic gate using the electrical model based on the initial estimate of the total delay time;

refining the initial estimate of the total delay time by using the driving voltage at the initial estimate of the total delay time as the basis for a linear interpolation to a later calculated delay time when the driving voltage will equal a predetermined switching threshold voltage;

repeating the steps of selecting a single logic gate, calculating an initial estimate, computing a predicted driving voltage, and refining the initial estimate for each logic gate which comprises the signal path;

calculating a total signal path delay time by summing the calculated delay time due to each logic gate and interconnect delay time;

repeating the steps of selecting a single logic gate, calculating an initial estimate, computing a predicted driving voltage, refining the initial estimate, and calculating a total signal path delay time for each signal path which comprises the digital circuit; and using the total signal path delay time for each signal path to modify the signal path so as to optimize the signal path delay time according to a predetermined target delay time.

2. The method for optimization of digital circuit delays of claim 1 wherein refining the electrical model by adjustment of predetermined parameters to enhance accuracy comprises:

adjusting parameters representing start time, input time, and intrinsic gate delay time.

3. The method for optimization of digital circuit delays of claim 1 wherein constructing the electrical model of the ideal logic gate comprises:

fabricating a prototype logic gate having a plurality of predetermined interconnect lines and plurality of predetermined loads;

measuring the delay time of the logic gate at each of a predetermined plurality of driving voltages;

recording the delay time of the prototype logic gate at each of the predetermined plurality of driving voltages; and predicting the driving time at a desired voltage.

4. The method for optimization of digital circuit delays of claim 1 wherein constructing the electrical model of the ideal logic gate comprises:

constructing a logic gate model of a single logic gate combined with a predetermined interconnect line and a predetermined load;

analyzing the logic gate model to derive a Laplace domain equation which describes the logic gate model;

inverting the Laplace domain equation to derive an equation which describes the driving voltage as a function of time; and predicting the driving voltage at a desired time by calculating the solution to the Laplace domain equation.

5. The method for optimization of digital circuit delays of claim 1 wherein calculating an initial estimate of the total delay time includes:

modifying the electrical model to create a modified electrical model having a delay time which is less than the delay time of the logic gate;

calculating a modified Elmore delay time for the modified electrical model.

6. A method for optimization of digital circuit delays, comprising:

choosing a signal path comprising a plurality of logic gates, a plurality of predetermined interconnect lines coupled to the logic gates, and a plurality of predetermined loads coupled to the predetermined interconnect lines;

choosing one logic gate together with the predetermined interconnect line coupled to that logic gate, and the predetermined load coupled to that predetermined interconnect line;

formulating a logic gate model which predicts a driving voltage as a function of a total delay time of the logic gate when driving a predetermined plurality of loads;

varying at least one predetermined parameter which controls the logic gate model so as to predict a delay time which is less than the actual delay time of the logic gate together with the predetermined interconnect line coupled to the logic gate, and the predetermined load coupled to the predetermined interconnect line;

calculating the driving voltage at the delay time predicted by the logic gate model;

linearly interpolating from the delay time predicted by the logic gate model so as to add a linearly interpolated delay time to the delay time predicted by the logic gate model to determine a calculated delay time when a linearly interpolated driving voltage will equal a predetermined switching threshold voltage;

repeating the steps of varying at least one predetermined parameter and linearly interpolating for each logic gate and predetermined interconnect line which comprises the signal path;

calculating a signal path delay time by summation of the calculated delay time of each logic gate and predetermined interconnect line which comprises the signal path; and altering the signal path delay time by modification of the signal path.

7. A method for optimization of digital circuit delays, comprising:

providing a digital circuit having at least one signal path which includes at least one logic gate, at least one predetermined interconnect line coupled to an output of the single logic gate, the predetermined interconnect line having an interconnect delay time, and at least one predetermined load coupled to the interconnect line;

selecting a single signal path from the digital circuit;

selecting from the single signal path a single logic gate, the predetermined interconnect line coupled to the output of the single logic gate, and the predetermined load coupled to the interconnect line;

calculating an initial estimate of total delay time of the logic gate which is known to be less than the actual total delay time;

formulating an electrical model of an ideal logic gate coupled to a predetermined interconnect line and a predetermined load;

analyzing the electrical model to derive a Laplace domain equation describing the electrical model;

deriving a voltage function equation by inversion of the Laplace domain equation which describes the driving voltage as a function of time;

solving the voltage function equation to determine the driving voltage at the initial estimate of the total delay time;

linearly interpolating the initial estimate of the total delay time to find a later calculated delay time when the driving voltage will equal a predetermined switching threshold voltage;

repeating the steps of selecting a single logic gate, calculating an initial estimate, solving the voltage function equation, and linearly interpolating the initial estimate for each logic gate which comprises the signal path;

summing the calculated delay time due to each logic gate and interconnect delay time to calculate a total signal path delay time;

repeating the steps of selecting a single logic gate, calculating an initial estimate, solving the voltage function equation, linearly interpolating the initial estimate, and summing the delay time due to each logic gate to calculate the total signal path delay time for each signal path which comprises the digital circuit; and modifying the signal path to optimize the signal path delay time according to a predetermined measurement criteria.

* * * * *